(12) United States Patent
Long

(10) Patent No.: US 7,486,095 B2
(45) Date of Patent: Feb. 3, 2009

(54) SYSTEM FOR MEASURING SIGNAL PATH RESISTANCE FOR AN INTEGRATED CIRCUIT TESTER INTERCONNECT STRUCTURE

(75) Inventor: John M. Long, San Jose, CA (US)

(73) Assignee: FormFactor, Inc., Livermore, CA (US)

( * ) Notice: Subject to any disclaimer, the term of this patent is extended or adjusted under 35 U.S.C. 154(b) by 0 days.

(21) Appl. No.: 11/532,877

(22) Filed: Sep. 18, 2006

(65) Prior Publication Data

US 2007/0007989 A1    Jan. 11, 2007

Related U.S. Application Data

(60) Continuation of application No. 10/750,611, filed on Dec. 29, 2003, now Pat. No. 7,109,736, which is a division of application No. 09/548,886, filed on Apr. 13, 2000, now Pat. No. 6,677,744.

(51) Int. Cl.
   *G01R 31/26* (2006.01)
(52) U.S. Cl. ........................... 324/765; 324/72.5
(58) Field of Classification Search ........... 324/754, 324/761–762, 765, 158.1, 719, 73.1, 713, 324/72.5; 438/FOR. 101, 14–18; 257/48
   See application file for complete search history.

(56) References Cited

U.S. PATENT DOCUMENTS

| | | | |
|---|---|---|---|
| 5,101,153 A | | 3/1992 | Morong, III |
| 5,221,905 A | * | 6/1993 | Bhangu et al. ............... 324/713 |
| 5,414,351 A | | 5/1995 | Hsu et al. |
| 5,532,600 A | | 7/1996 | Hoshino |
| 5,617,035 A | | 4/1997 | Swapp |

(Continued)

FOREIGN PATENT DOCUMENTS

DE    19756466    7/1998

(Continued)

OTHER PUBLICATIONS

Yasuhiko, O., "Semiconductor Integrated Circuit", *Patent Abstracts of Japan*, vol. 16, No. 397, Publication No. 04129417, Apr. 30, 1992.

*Primary Examiner*—Ha Tran T Nguyen
*Assistant Examiner*—Tung X Nguyen
(74) *Attorney, Agent, or Firm*—N. Kenneth Burraston

(57) ABSTRACT

Resistances of signal paths within a interconnect structure for linking input/output (I/O) ports of an integrated circuit (IC) tester to test points of an IC are measured by the IC tester itself. To do so the interconnect structure is used to link the tester's I/O ports to a similar arrangement of test points linked to one another through conductors. Drivers within the tester, which normally transmit digital test signals to IC test points via the I/O ports when the IC is under test, are modified so that they may also either transmit a constant current through the I/O ports or link the I/O ports to ground or other reference potential. The tester then transmits known currents though the signal paths interconnecting the tester's I/O ports. Existing comparators within the tester normally used to monitor the state of an IC's digital output signals are employed to measure voltage drops between the I/O ports, thereby to provide data from which resistance of signal paths within the interconnect structure may be computed.

27 Claims, 5 Drawing Sheets

U.S. PATENT DOCUMENTS

| | | | |
|---|---|---|---|
| 5,736,850 A * | 4/1998 | Legal | 324/158.1 |
| 5,760,599 A | 6/1998 | Ehiro | |
| 6,022,750 A | 2/2000 | Akram et al. | |
| 6,055,661 A * | 4/2000 | Luk | 714/736 |
| 6,075,374 A | 6/2000 | Dakeyama | |
| 6,087,843 A | 7/2000 | Pun et al. | |
| 6,181,144 B1 * | 1/2001 | Hembree et al. | 324/754 |
| 6,218,848 B1 | 4/2001 | Hembree et al. | |
| 6,300,757 B1 | 10/2001 | Janssen | |
| 6,456,103 B1 | 9/2002 | Eldridge et al. | |
| 6,677,744 B1 | 1/2004 | Long | |
| 7,109,736 B2 | 9/2006 | Long | |

FOREIGN PATENT DOCUMENTS

| | | |
|---|---|---|
| JP | 04-129417 | 4/1992 |
| TW | 163894 | 7/1991 |

* cited by examiner

SYSTEM FOR MEASURING SIGNAL PATH RESISTANCE FOR AN INTEGRATED CIRCUIT TESTER INTERCONNECT STRUCTURE

CROSS-REFERENCE TO RELATED APPLICATIONS

This application is a continuation of U.S. patent application Ser. No. 10/750,611, filed Dec. 29, 2003 now U.S. Pat. No. 7,109,736, which is a division of U.S. patent application Ser. No. 09/548,886, filed Apr. 13, 2000 (now U.S. Pat. No. 6,677,744).

BACKGROUND OF THE INVENTION

1. Field of the Invention

The present invention relates in general to integrated circuit (IC) testers and in particular to a system for measuring the resistance of signal paths through an interconnect structure for linking an IC tester to test points on an IC to be tested.

2. Description of Related Art

It has become increasing popular to test integrated circuits while they are still in the form of die on a wafer. To do so, an IC tester must contact hundreds or thousands of test points on a wafer through an interconnect structure capable of providing a large number of signal paths between a tester's input/output (I/O) ports and test points on a wafer. Since the I/O ports of an IC tester are distributed over a much wider horizontal area than the test points they access, an interconnect structure linking those I/O ports to the test points can be a relatively complicated structure including more than one interconnected signal routing layer and numerous probes, pins and/or contact points that must be precisely aligned and in good contact with one another to provide the necessary signal paths.

Before testing a wafer we would like to confirm that the interconnect structure can provide the necessary signal paths between the test head and the wafer. A connection failure may arise, for example, due to a contact misalignment, broken, missing or contaminated pins, probes or contact pads, open circuit or short circuit faults within interconnect structures or within test heads. In many applications we also would like to verify that the resistance of a signal path between each test head I/O port and a corresponding test point on a wafer is within acceptable limits. Interconnect structure assemblies are usually designed to provide signal paths having particular resistances, and variations from the intended resistance, due for example to corrosion or contamination on contact pads or the tips of probes, can distort test results.

The resistances of signal paths within an interconnect structure are typically tested during the manufacturing process using conventional resistance measurement equipment accessing ends of the signal paths via small probes. However signal paths within an interconnect structure can fail after it leaves the factory when the structure is in use in an integrated circuit tester, and it is difficult and inconvenient to periodically remove an interconnect structure from a tester and manually test the continuity and resistance of its signal paths. Open and short circuit signal path failures can often be detected, or at least suspected, when an interconnect structure is in use because such path failures normally lead to characteristic patterns of IC test failures. However when a signal path has a resistance that is marginally outside an acceptable range, IC test failures may not exhibit a clear pattern. Some die will pass and some die will fail a test. Thus die can be improperly rejected as failing a test when the source of the failure was in fact the interconnect structure, and it may not be readily apparent that the failures are the fault of the interconnect structure, not the rejected die.

Thus what is needed is a convenient method for quickly measuring the resistance of signal routing paths through an interconnect structure without having to remove it from its working environment.

SUMMARY OF THE INVENTION

The present invention permits an integrated circuit (IC) tester to measure resistances of signal paths within an interconnect structure linking input/output (I/O) ports of the IC tester to test points of an IC.

In accordance with one aspect of the invention, drivers within the tester, which normally transmit digital test signals to IC test points via the I/O ports when the IC is under test, are modified so that they may also either transmit a constant current through the I/O ports or link the I/O ports to ground or other reference potential.

In accordance with another aspect of the invention, the impedance of signal paths in the interconnect structure is measured by first using the interconnect structure to link the tester's I/O ports to a similar arrangement of test points tied to one another through conductors.

In accordance with a further aspect of the invention, the tester then transmits currents of known constant magnitude though the signal paths interconnecting the tester's I/O ports while comparators within the tester, normally used to monitor the state of an IC's digital output signals, are employed to measure voltage drops between the I/O ports, thereby providing data from which resistance of signal paths within the interconnect structure may be computed.

The invention enables a IC tester to measure the impedance of signal paths through the interconnect structure, with relatively minor modifications to the tester's driver circuits.

It is accordingly an object of the invention to provide means for measuring the impedance of signal paths linking ports of an IC tester and test points on an IC.

The concluding portion of this specification particularly points out and distinctly claims the subject matter of the present invention. However those skilled in the art will best understand both the organization and method of operation of the invention, together with further advantages and objects thereof, by reading the remaining portions of the specification in view of the accompanying drawing(s) wherein like reference characters refer to like elements.

BRIEF DESCRIPTION OF THE DRAWING(S)

Figure 7:
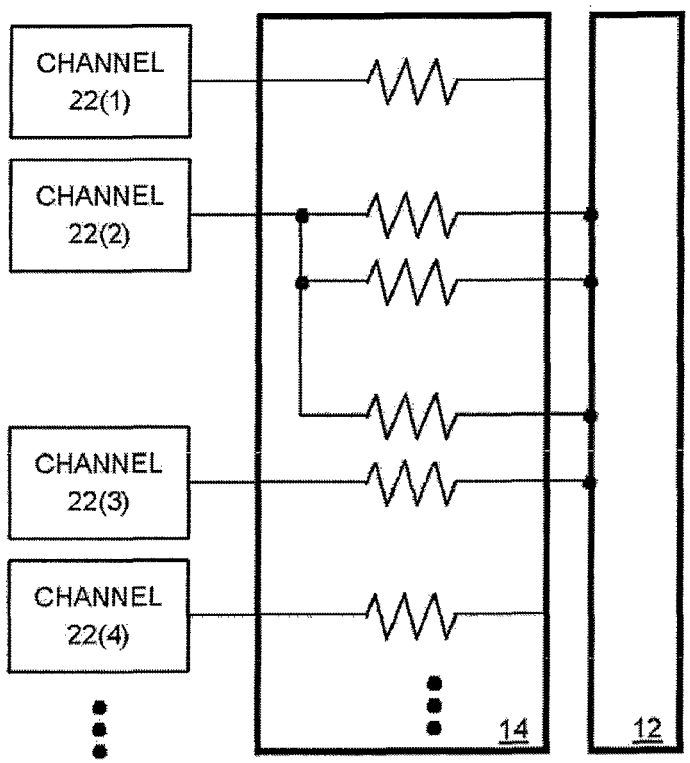
Figure 8:
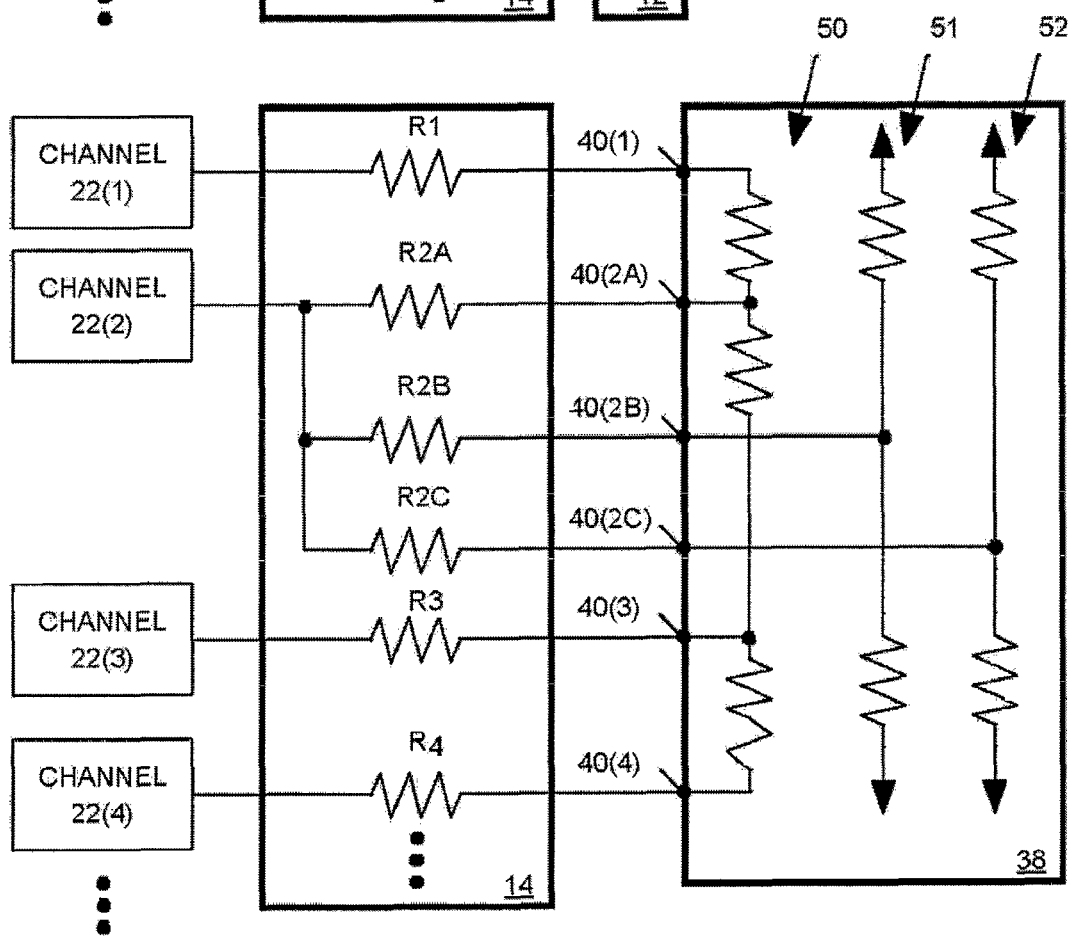

FIG. 7 illustrates in block diagram form an interconnect structure linking I/O terminals of a set of tester channels to points on a IC to be tested; and FIG. 8 illustrates in block diagram form a manner in which the IC tester of FIG. 7 may be linked to a reference wafer via the interconnect structure of FIG. 7 so as to permit the tester to measure path impedances through the interconnect structure in accordance with the invention.

DESCRIPTION OF THE PREFERRED EMBODIMENT(S)

The present invention relates to a method and apparatus for measuring the resistance of signal paths through an interconnect structure providing signal paths between input/output (I/O) ports of a wafer level integrated circuit (IC) tester and test points on an IC wafer to be tested. Since the nature of the invention is best understood in the context of an IC tester architecture, a typical IC tester architecture is briefly outlined below.

Integrated Circuit Tester

Figure 1:
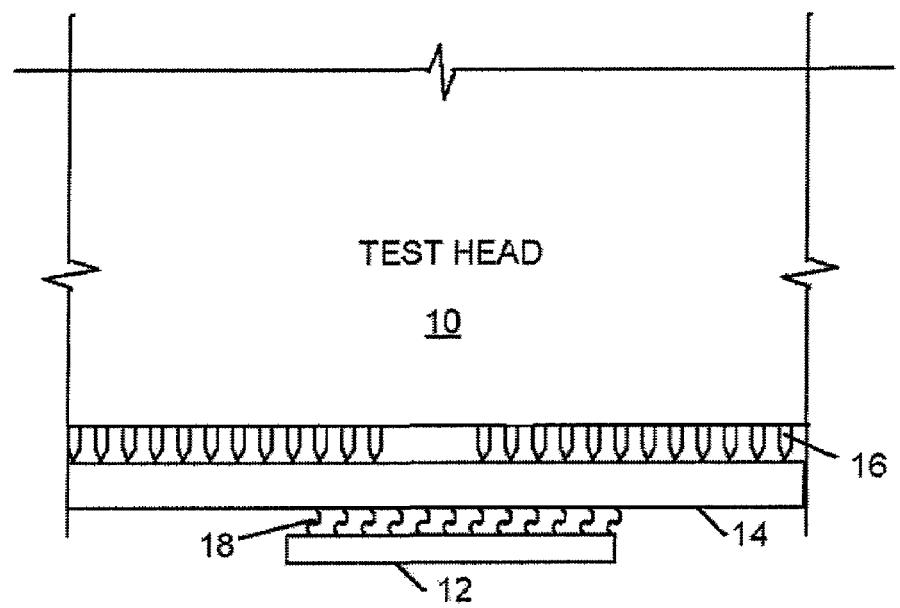
FIG. 1 is a simplified partial elevation view of a test head of an integrated circuit (IC) tester employing tester channels in accordance with the invention to access a wafer under test via a conventional interconnect structure.
Figure 2:
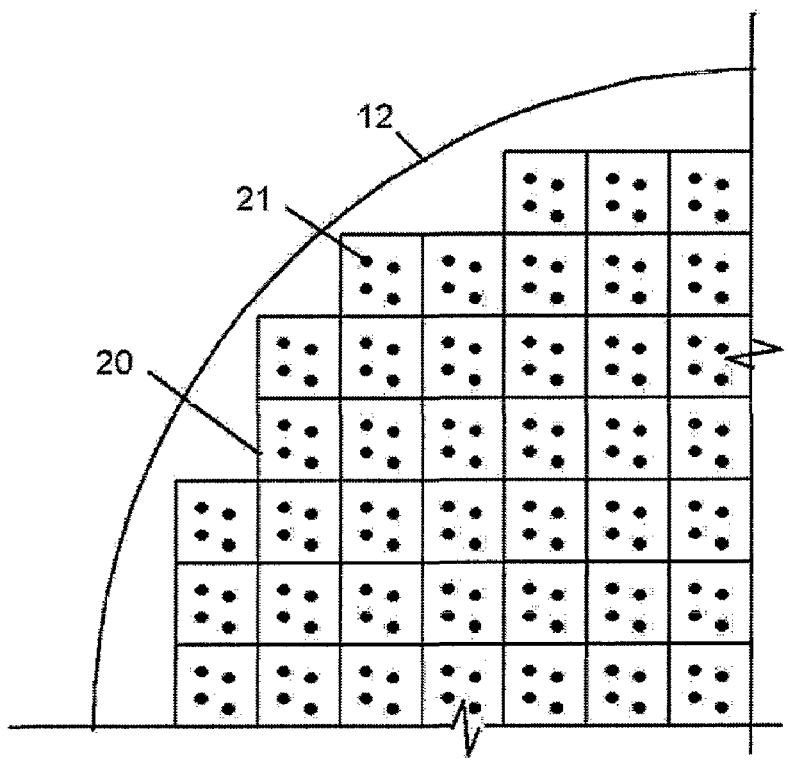
FIG. 2 is a simplified partial plan view of a portion of a typical wafer.
Figure 3:
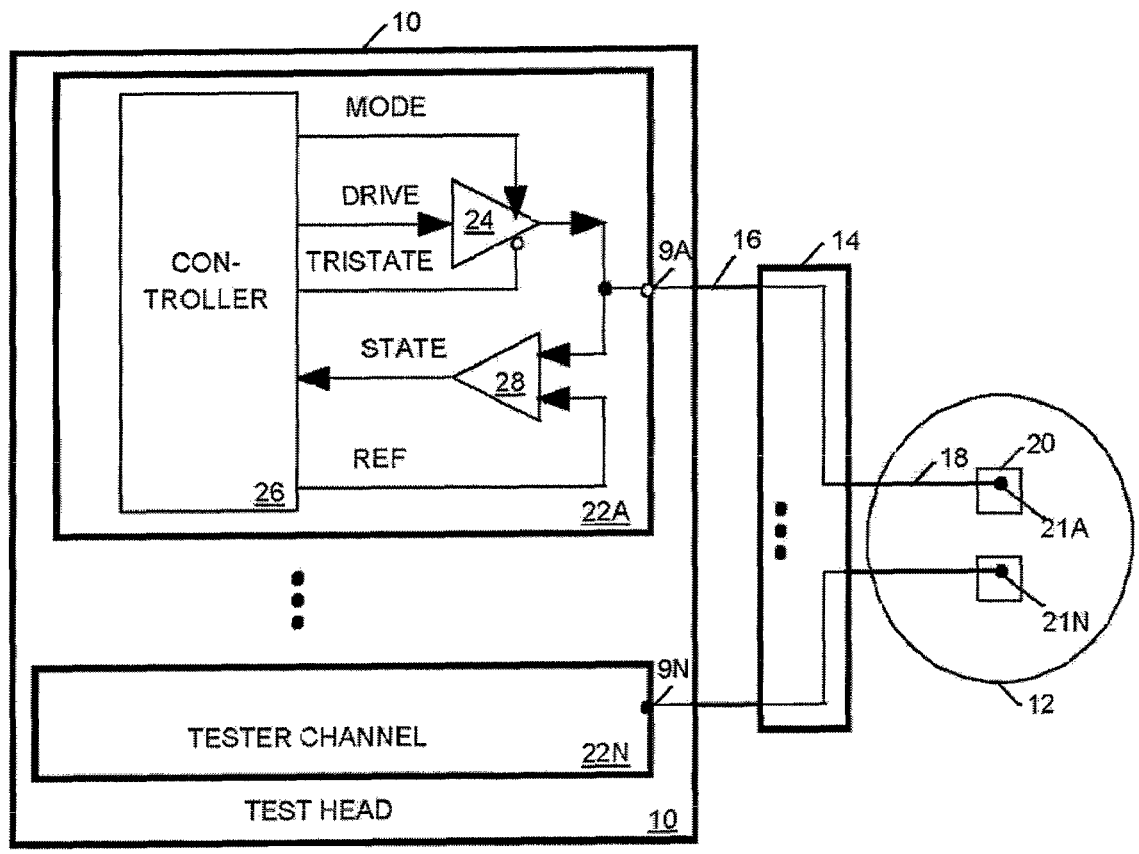
FIG. 3 represents in simplified block diagram form prior art tester channels implemented by the test head of FIG. 1 accessing pads of an IC wafer via the interconnect structure of FIG. 1.

FIG. 1 is a simplified partial elevation view of a test head 10 of an IC tester accessing test points on a wafer under test 12 via a conventional interconnect structure 14. FIG. 2 is a simplified plan view of a portion of a wafer 12, and FIG. 3 is a simplified block diagram representing tester circuits that may be mounted in test head 10 of FIG. 1. Referring to FIGS. 1-3, test head 10 holds a set of circuit boards implementing circuits for carrying out both digital tests on ICs implemented in the form of die 20 on wafer 12. In this example each die 20 includes several test points 21 providing signal input/output (I/O) access to the circuits the die implement. For simplicity FIG. 2 illustrates each die 20 as having only four test points 21, but IC die typically have a much larger number of test points. I/O ports 9 of test head 10 access pads on an upper surface of interconnect structure 14, for example, via a set of pogo pin connectors 16. Interconnect structure 14 in turn may access test points 21 on wafer 12 via a set of probes 18 and provides signal paths between test points 21 and probes 18.

There are many ways for a conventional interconnect structure 14 to contact test points on a wafer die. For example each test point 21 may be a conductive pad on the surface of wafer 12 and case probes 18 attached to an underside of interconnect structure 14 may have tips for contacting the pads. Alternatively spring contacts may be attached to I/O pads on the surface of wafer 12 itself, and pads on the under surface of interconnect structure 14 may act as "probes" 18 accessing tips of the spring contacts which act as the wafer's "test points" 21. The invention is applicable to any type of interconnect structure.

Test head 10 holds circuit boards implementing a set of tester channels 22 for accessing test points 21 of wafer 12. Each channel 22 includes a driver 24 for transmitting a digital test signal via the channel's I/O port 9 to the corresponding test point 21 and a comparator 28 receiving signals appearing at I/O port 9. Each channel include a conventional programmable test controller 26. During a digital test, the test controller 26 within each channel 22 supplies precisely timed signals (TRISTATE and DRIVE) to driver 24 to set the state (high, low or tristate) of the test signal sent to test point 21. Test controller 26 also supplies an adjustable reference voltage (REF) to an input to comparator 28. Comparator 28 generates an output signal (STATE) supplied to test controller 26 to signal whether the IC output signal is higher or lower in voltage than the REF signal, thereby indicating the logic state of the IC output signal.

Since pogo pins 16 are distributed over a much wider horizontal area than probes 18, interconnect structure 14 must provide signal paths extending in both horizontal and vertical directions to interconnect pogo pins 16 and probes 18. Thus interconnect structure 14 may be relatively complicated having more than one interconnected layer. Before testing wafer 12, we would like the IC tester to be able to quickly confirm that interconnect structure 14 will provide a signal path of appropriate resistance between the test head I/O ports 9 and the test points 21 on wafer 12.

To measure the resistance of a signal path we can ground one end of the path, send a current of known magnitude through the path, and then measure the voltage at the ungrounded end. The path resistance is equal to the measured voltage divided by the current. In accordance with the invention, tester 10 is adapted to measure impedances in this manner.

Referring to FIG. 3, if we provide a reference wafer having a set of test points similar in arrangement to points 21 of the wafer 12 to be tested, but having conductive paths linking those test points, then I/O ports 9 of various channels 22 will be linked through conductive paths. If each channel 22 is capable of generating a constant current output at its output I/O port 9, measuring a voltage at its output port 9, and/or grounding its output port 9, then tester 10 can measure the resistances of signal paths through interconnect structure 14 in various ways described below. For example, if test points 21A and 21N are conductively linked, then when channel 22N grounds its I/O port 9N, channel 22A can determine the resistance of the signal path between I/O ports 9A and 9N by sending a current of known magnitude through that path and measuring the voltage at ports 9A and 9N. The path resistance is equal to the voltage difference divided by the current.

Of course, we would like to know the separate "one-way" path resistances of the path between port 9A and test point 21A and the path between port 9N and test point 21B, not just the total "round-trip" path resistance between ports 9A and 9N. However, as explained below, by measuring resistances of several "round-trip" path combinations tester 10 can determine resistances of all "one-way" paths though interconnect structure 14. However before discussing the various ways in which tester 10 can measure path resistances, we first describe how each channel 22 is adapted to measure a voltage at its I/O port 9, to supply a constant current output at its I/O port 9, and to ground its I/O port 9.

Comparator

Tester channel 22, like typical prior art digital tester channels, includes a comparator 28 for producing an output signal STATE indicating whether an input signal arriving at I/O port 9 is higher or lower in voltage than reference signal REF. During digital tests, test controller 26 sets the REF signal magnitude between specified high and low logic levels so that the comparator 28 output signal STATE indicates the logic state of the signal appearing at I/O port 9. However comparator 28 is also capable of being operated in a way that allows channel 22 to measure a voltage appearing at I/O port 9 during path resistance measurements. For example test controller 26 may monotonically increase or decrease the voltage magnitude of the REF signal input to comparator 28 until it detects a change of state of the STATE signal output of comparator 28. The magnitude of the REF signal voltage at the point when the STATE signal changes state is equal to the magnitude of the signal at I/O port, within the resolution of the step size by which test circuit 26 varies the REF voltage. Test controller 26 may alternatively vary the REF signal in any of many well-known search patterns to more quickly determine the REF signal levels most closely bounding the voltage level at I/O port 9.

Driver

In a typical prior art tester channel, a tristate driver producing the channel's output signal may tristate that output signal or may set it to either of two voltage levels, the high and low logic levels of the device under test. The driver is not, however, capable of producing a constant current output signal. In accordance with the invention, we provide a "5-state" driver 24 that, in addition to providing high, low and tristate output levels, is also capable of producing a constant current output signal input I/O port 9 or of grounding I/O port 9.

Figure 4:
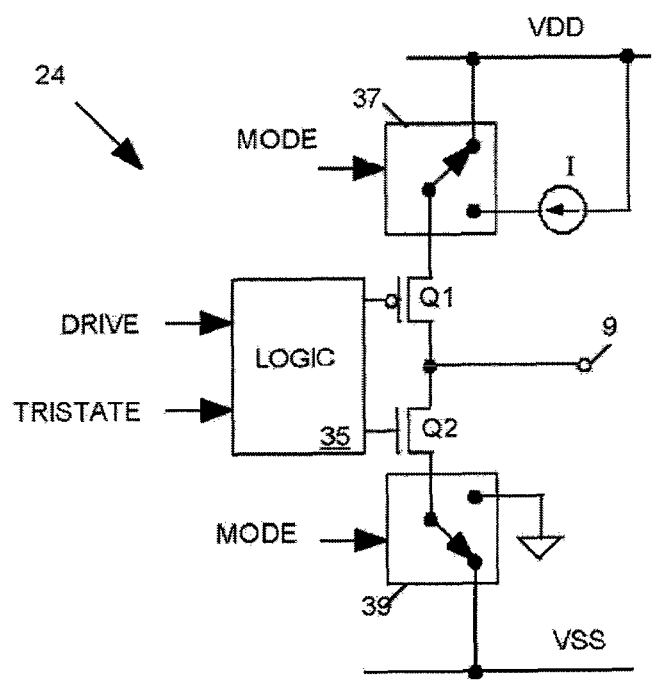
FIG. 4 is a combination block and schematic diagram of a driver of FIG. 3 in accordance with the invention.

FIG. 4 is a combination block and schematic diagram of driver 24 of FIG. 3. Driver 24 is generally similar to conventional tristate drivers in that it includes an NMOS transistor Q1 and a PMOS transistor Q2 having gates driven by a logic circuit in response to the DRIVE and TRISTATE signals from test controller 26. When the TRISTATE signal is true, logic circuit 35 turns off both Q1 and Q2 to tristate I/O port 9. When the TRISTATE signal is false and the DRIVE signal is true, logic circuit 35 turns on Q1 and turns off Q2 thereby driving I/O port 9 up. When the TRISTATE signal is false and the DRIVE signal is false, logic circuit 35 turns off Q1 and turns on Q2 thereby pulling down on I/O port 9. In a conventional tristate driver, drain and source terminals of transistors Q1 and Q2 are respectively tied directly to supply voltages VDD and VSS, and these voltages determine the high and low logic levels of the driver's output signal. However in driver 24 of the present invention, transistor Q1 is tied to VDD via a switch 37 and transistor Q2 is tied to VSS through a switch 39. A MODE signal output of test controller 26 of FIG. 3 controls both switches 37 and 39. During digital tests, the MODE signal sets switches 37 and 39 to link transistors Q1 and Q2 to VDD and VSS so that driver 24 acts like a conventional tristate driver. However when the path resistances of interconnect structure 14 are to be measured, test controller 26 sets switch 37 to connect a current source I to the drain of transistor Q1 and set switch 39 to ground the source of transistor Q2. Thereafter when test controller 26 sets the TRISTATE signal false, driver 24 may either send a constant current through the signal path connected to I/O port 9 or will ground I/O port 9 depending on the state of the DRIVE signal. Otherwise, when I/O port 9 is to be neither grounded nor receive a constant current from driver 24, test controller 26 may set the TRISTATE signal true to tristate the output of driver 24.

Path Resistance Measurement

Figure 5:
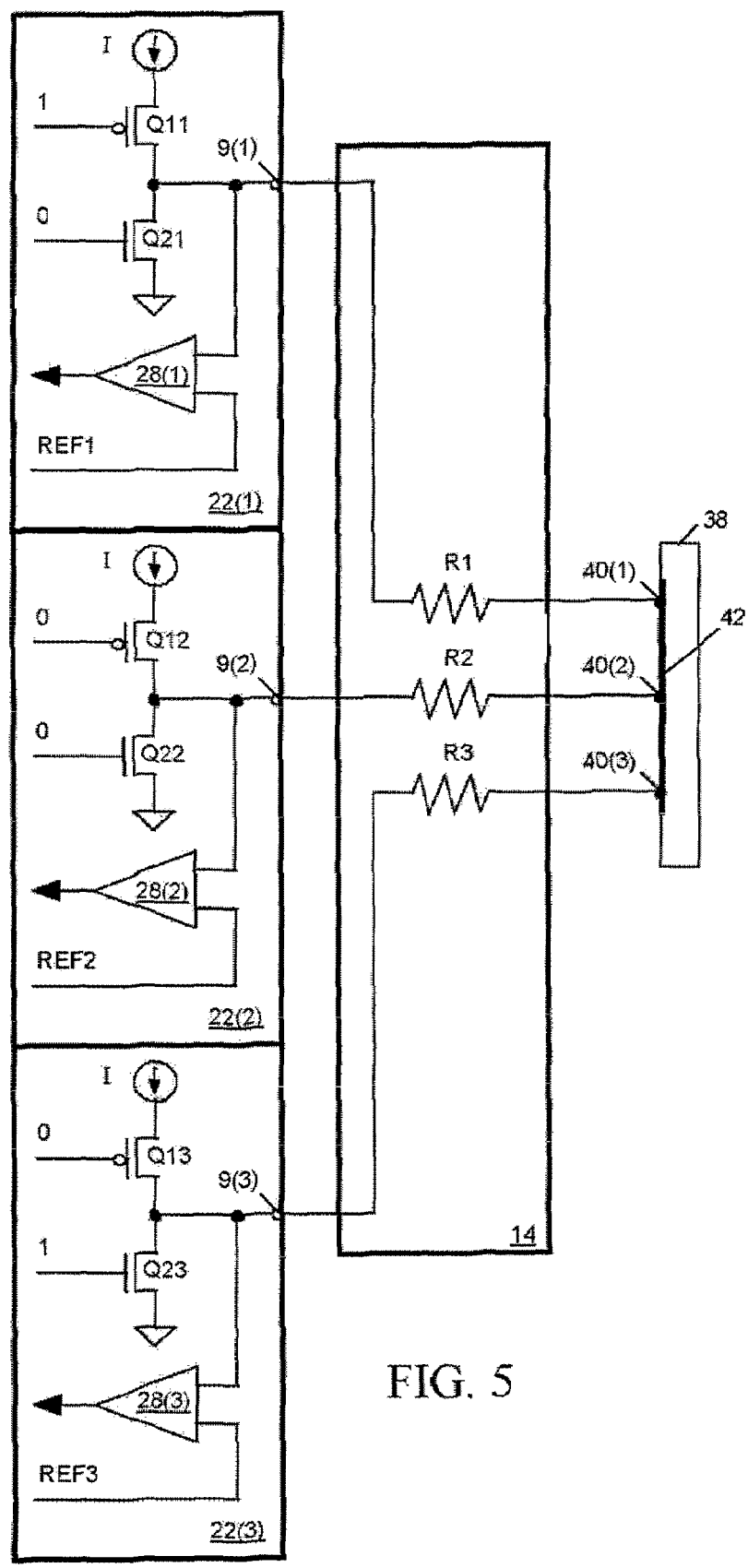
FIG. 5 is a simplified combination block and schematic diagram illustrating portions of three tester channels linked through an interconnect structure to a reference wafer in a manner permitting the tester channels to measure path impedances through the interconnect structure in accordance with the invention.

FIG. 5 is a simplified combination block and schematic diagram illustrating portions of three tester channels 22(1)-22(3) linked through interconnect structure 14 to a reference wafer 38. (For simplicity, the switches 37 and 39 of FIG. 4, which are set to connect the driver transistors to current source and ground during resistance testing, are omitted from FIG. 5.) Other tester channels (not shown) are linked to other test points on reference wafer 38 in a similar manner. Reference wafer 38 is similar in size and shape to the wafer 12 (FIG. 1) to be tested, and we position reference wafer 38 under interconnect structure 14 (FIG. 1) in place of the wafer 12 to be tested when we want to measure signal path resistances within the interconnect structure. Reference wafer 38 has a pattern of test points 40(1)-4(3) (and others not shown) on its surface mimicking the pattern of test points on the surface of wafer 12. Thus with the reference wafer appropriately positioned under interconnect structure 14, the I/O ports 9(1)-9(3) of channels 22(1)-22(3) will have access to corresponding test point 40(1)-40(3) of reference wafer 38. Test points 40(1)-40(3) are all linked by a conductor 42 implemented within reference wafer 38.

The path resistances between tester I/O ports 9(1)-9(3) and corresponding test points 40(1)-40(3) are represented in FIG. 5 by a set of resistors R1-R3. As described below, these "one-way" path resistances can be calculated from results of a set of three "round-trip" path resistance measurements.

The tester first measures a round-trip path resistance RA=R1+R3 between ports 9(1) and 9(3). To do so, we turn on transistor Q11 of channel 22(1) and transistor Q23 of channel 22(3) so that constant current I flows from I/O port 9(1) to ground via path resistances R1 and R3 and transistor Q23. We turn off all other transistors Q21, Q12, Q22 and Q13. Channel 22(1) then suitably varies the reference signal input (REF1) to its comparator 28(1) to determine the voltage at I/O port 9(1). Path resistance RA is equal to this voltage divided by the magnitude of current I.

The tester then uses a similar procedure to measure a round-trip path resistance RB=R1+R2 between ports 9(1) and 9(2) by turning on transistors Q11 and Q22 and turning off all other transistors Q21, Q12, Q13 and Q23 so that constant current I flows from I/O port 9(1) to around via path resistances R1 and R2 and transistor Q22. Channel 22(1) then again varies the reference signal input (REF1) to its comparator 28(1) to determine the voltage at I/O port 9(1). Path resistance RB is equal to this voltage divided by the magnitude of current I.

Finally the tester measures a round-trip path resistance RC=R2+R3 between ports 9(2) and 9(3) by turning on transistors Q12 and Q23 and turning off all other transistors Q11, Q21, Q22 and Q13 so that constant current I flows from I/O port 9(2) to ground via path resistances R2 and R3 and transistor Q23. Channel 22(2) then suitably varies the reference signal input (REF2) to its comparator 28(2) to determine the voltage at I/O port 9(2). Path resistance RC is equal to this voltage divided by the magnitude of current I.

We now have three equations in three unknowns (R1, R2 and R3:

$$RA=R1+R3$$

$$RB=R1+R2$$

$$RC=R2+R3$$

Solving for R1, R1 and R3 we have, $$R1=(+RA-RB+RC)/2$$

$$R2=(-RA+RB+RC)/2$$

$$R3=(+RA+RB-RC)/2.$$

Therefore, as long as reference wafer 38 links all test points 40 in groups of at least three, the tester can use the above-described procedure to produce data allowing a host computer to determine the resistance of each path between an I/O port 9 of an tester channel 22 and a test point on the reference wafer 38 to which it is linked.

Switch 39 may be omitted from the circuit FIG. 4 so that transistor Q2 remains connected to VSS during resistance measurement tests instead of being grounded. In such case the magnitude of VSS should be subtracted from the measured voltage magnitude of the test signal at its source I/O port.

Referring to FIG. 5, when impedances of transistors Q12, Q22 and Q23 are significant compared to the path resistances being measured, the voltage of a test signal receiving I/O ports should be measured and used to offset the voltage of the test signal sending I/O port when measuring path resistances. For example, when measuring path resistance R1+R3, tester channel 22(3) should be operated so as to measure the voltage at I/O port 9(3) when channel 22(1) is transmitting the test current I via port 9(1) and measuring the voltage at I/O port 9(1). The path impedance R1+R2 is then computed by dividing the voltage difference between I/O ports 9(1) and 9(3) by the magnitude of current I. This approach also eliminates the need for switch 39.

Alternative Impedance Measuring Method

The above-described method can be used when the resistance of the conductor 42 of reference wafer 38 between test points 40(1)-40(3) is negligibly small compared to resistances R1-R3. This is typically the case when interconnect structure 14 places resistors in the signal paths. However when interconnect path resistance R1-R3 are sufficiently low, the inherent path resistances of conductors 42 within the reference wafer 38 can unduly influence the results of the above-described resistance measurement method. Also, since a defect in any of conductors 42 could make one or more of resistances R1-R3 appear higher than it really is, we would like to provide a way for the tester to measure path resistances R1-R3 that separates out the path resistances associated with conductor 42.

Figure 6:
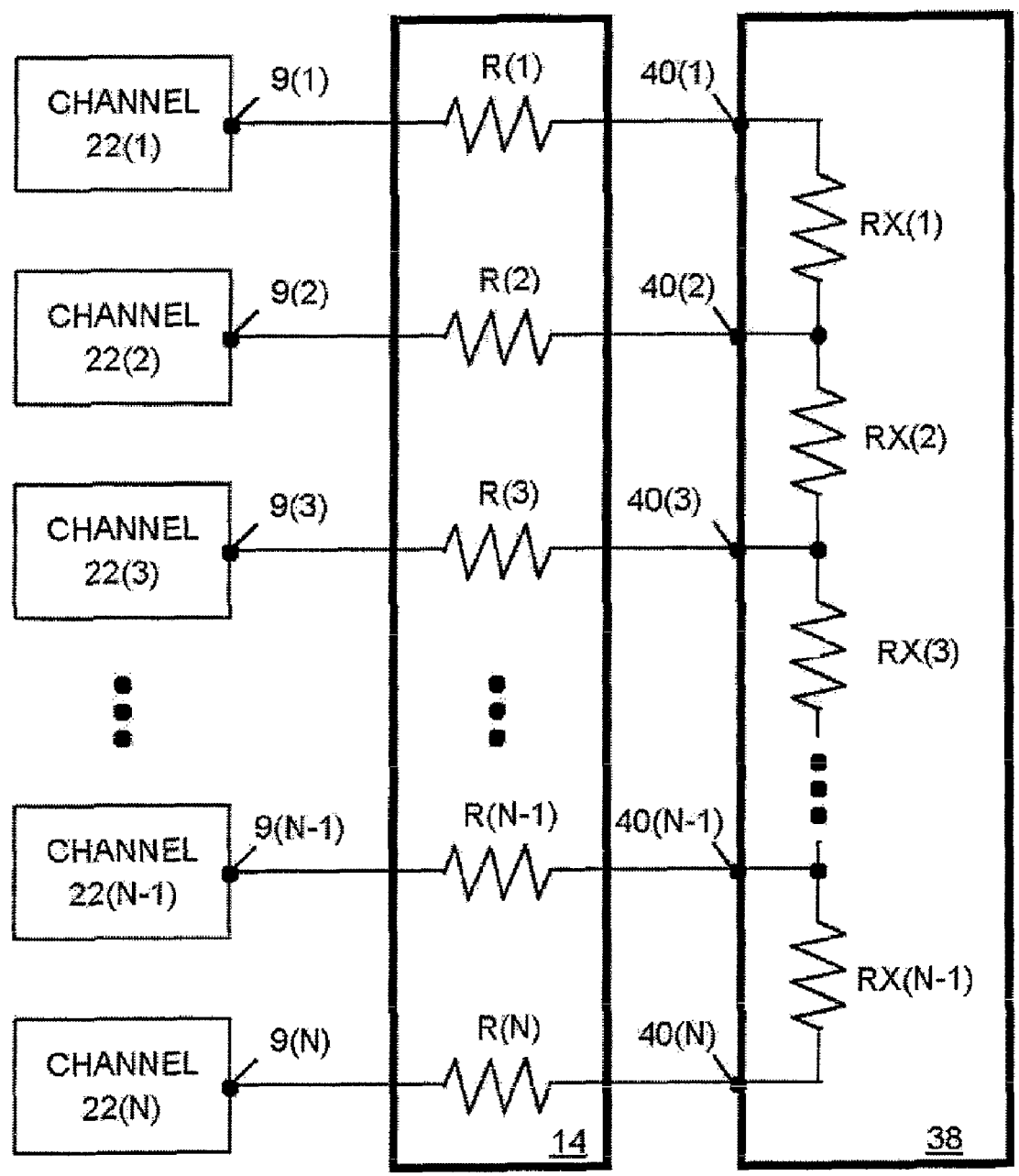
FIG. 6 illustrates in block diagram form a manner in which an IC tester may be linked to a reference wafer via an interconnect structure so as to permit the tester to measure path impedances through the interconnect structure in accordance with the invention.

FIG. 6 illustrates a test configuration in which output ports 9(1)-9(N) a set of N channels 22(1)-22(N) are connected via paths through an interconnect structure 14 to a set of test points 40(1)-40(N) on reference wafer 38 which are connected to form a series network by conductors within the reference wafer. A set of resistors R(1)-R(N) represent the path resistances through interconnect structure 14 while a set of resistors RX(1)–RX(N−1) represent the inherent path resistances of the conductors linking test points 40(1)-40(N).

To measure the interconnect path resistances, the tester first sets channel 22(1) to produce a constant current output at port 9(1) and sets channel 22(N) to ground port 9(N). All other channels 22(2)-22(N−1) are set to tristate their drivers. Each channel 22(1)-22(N−1) then measures the voltage at its corresponding port 9(1)-9(N−1). Since essentially no current passes through resistors R(2)-R(N−1), the voltage measured at each port 9(2)-9(N−1) is nearly equal to the voltage appearing at a corresponding test point 40(2)-4(N−1). Accordingly a host computer having access to the port voltage measurements can determine path resistance RX(2) by dividing the difference between the measured voltage at ports 9(2) and 9(3) by the current supplied by channel 22(1). The host computer can also find the sum R(1)+RX(1) by dividing the difference between measured voltages at port 9(1) and 9(2) by the supplied current and the sum R(N)+RX(N−1) by dividing the difference between measured voltages at ports 9(N−1) and 9(N) by the supplied current. Thus the host computer can determine RX(1)-RX(N−1), R(1)+RX(1), and R(N)+RX(N−1).

The tester now sets channel 22(1) to supply a constant current at port 9(1), set channel 22(2) to ground port 9(2), and set all other channels to tristate their ports 9(3)-9N). Channel 22(1) then measures the voltage at port 9(1). Dividing the port voltage channel 22(1) detects by the supplied current, we obtain a resulting resistance equal to R1+RX(1)+R(2). Since the host computer already knows the sum R1+RX(1), it can subtract that sum from the result to find the value of R(2).

The tester next sets channel 22(1) to supply a constant current at port 9(1), sets channel 22(3) to ground port 9(3), and sets all other channels to tristate their I/O ports. Since essentially no current passes through R(2), the voltage at test point 40(2) is essentially the same as the voltage channel 22(2) detects at port 9(2). Thus dividing the voltage channel 22(2) detects by the supplied current, provides a result equal to RX(2)+R(3). Since the host computer already knows the value of RX(2), it can subtract that value from the result to find the value of R(3).

The tester may follow similar procedures to determine all path resistances R(2)-R(N−1) in turn. The tester cannot, however, provide data sufficient to allow a host computer to determine resistances R(1) or R(N) separate from resistances RX(1) and RX(N−1). But this need not be a problem when channels 22(1) and 22(N) are "spare" tester channels not used to access test points on the wafer that is to be tested and the interconnect paths through resistors R(1) and R(N) are spare paths not used when the tester subsequently tests an IC. Hence it isn't necessary to determine resistances R(1) and R(N) apart from resistances RX(1) and RX(N−1). We do have to ensure, however, that interconnect structure 14 has the extra paths needed to link the spare channels 22(1) and 22(N) to test points 40(1) and 40(N) on reference wafer 38, that reference wafer 38 includes the extra test points 40(1) and 40(N), and that the reference wafer connects points 40(1) and 40(N) at opposite ends of the series network of interconnected test points 40(2)-40(N−1).

Note that it is not necessary for conductors in reference wafer 38 to link all test points 40 into one large series network; wafer 38 may include several independent series networks of test points. However each network should include at least three test points, and the first and last test points of each network should be accessed by spare tester channels unless the resistance of the paths within the reference wafer is negligible compared to the interconnect path resistances. By decreasing test point network size and increasing the number of networks, we increase the speed with which the tester can measure path resistances because we increase the number of impedance measurements that it can perform concurrently. However at the same time we may also increase the number of spare channels needed, since each additional network requires two additional spare channels when the measurement must account for path resistances within the reference wafer.

Impedance Measurement in Bused Interconnects

In some applications, an interconnect structure can "bus" paths interconnecting a single tester channel port to more than one test point on a wafer to be tested, for example when the test points are power and ground terminals.

FIG. 7 illustrates an interconnect structure 14 linking tester channels 22(2) and 22(3) to points on a reference wafer 12. Note that interconnect structure 14 includes paths linking tester channel 22(2) to three test points on a wafer 12 instead of just one. In this example channels 22(1) and 22(4) are spare channels. Interconnect structure 14 also links other tester channels (not shown) to other test points (not shown) on wafer 12.

FIG. 8 illustrates a reference wafer 38 including conductors linking the test points accessed by interconnect structure 14 into three networks 50-52. The conductors in reference wafer 38 link test points 40(1), 40(2A), 40(3) and 40(4) into a common network 50 to allow channels 22(1)-22(4) to measure the path resistances R2A and R3 in the manner described above.

Test points 40(2B) and 40(2C) are linked to separate networks 51 and 52. Thus, channel 22(2), working together with other tester channels (not shown) linked to networks 51 and 52 can separately measure path resistances R2B and R2C using procedures described above. Note that if test points 40(2B) and 40(2C) were tied into network 50, it would not be possible for tester channels to separately determine path resistances R2A-R2C. Note also that path resistances associated with the three networks 50-52 should not be measured concurrently. For example when measuring the resistances associated with network 50, all of the tester channels connected to networks 51 and 52 should be tristated so that test currents passing through network 50 do not find paths to ground though resistors R2B or R2C.

Alternative Embodiments

Thus has been shown and described a system for testing resistance of signal paths through any kind of interconnect structure linking ports of an integrated circuit tester to points of an IC wafer under test. While the forgoing specification has described preferred embodiment(s) of the present invention, one skilled in the art may make many modifications to the preferred embodiment without departing from the invention in its broader aspects. For example, referring to FIG. 4, switch 39 may be omitted from driver 24 by connecting the source of transistor Q2 directly to VSS. In such case the known supply voltage VSS, rather than ground potential (0 volts), may be used as a reference potential when making resistance measurements. For example, referring to FIG. 5, suppose Q23 were to link port 9(2) to VSS instead of ground as shown, while channel 22(1) is sending current I through the path having resistance R1+R2. Then in order to determine the magnitude of R1+R3, we subtract VSS from the voltage measured at port 9(1) and divide the result by the magnitude of I. Thus while in the preferred embodiment the driver 24 of one of the tester channels always grounds a port during a path resistance measurement operation, the driver could alternatively connect the port to any known reference potential provided that all measured voltages are offset by the reference potential offsets voltage when calculating resistance values. Using ground as a reference potential is preferred, however, because it eliminates errors that arise from any noise or inaccuracy in the reference potential.

Also, referring to FIG. 5, contact points 40 and conductor 42 need not necessarily be implemented on reference wafer 38; any conductor providing interconnected contact points 40 accessible to interconnect structure 14 may be employed to carry out the function of reference wafer 38. However a reference wafer similar in size shape to the wafer to be tested is a convenient way of arranging the necessary test point networks and such a reference wafer fits well into a wafer chuck or other structure that normally holds the wafer to be tested.

The present invention is also useful in measuring path resistances in structures (e.g. load boards) for interconnecting an IC tester to ICs in forms other than die on wafers, for example packaged ICs. For example, a packaged IC is usually tested while mounted on a load board, a circuit board providing an IC tester with access to the IC's test points, i.e., its package leads. To measure the impedance of interconnect paths, including paths through the load board, the packaged IC may be replaced on the load board with an IC package having terminals ("test points") interconnected by bond wires or other conductors to form the necessary test point networks. The path impedances may then be measured as described above.

The appended claims therefore are intended to cover all such modifications as fall within the true scope and spirit of the invention.

What is claimed is:

1. A method of determining resistances of electrical paths in an interconnect structure, the electrical paths connecting ports of the interconnect structure to test points of the interconnect structure, the test points for contacting electronic devices to be tested, wherein the ports are connectable to communications channels of a tester configured to control testing of the electronic devices, the method comprising:

connecting the ports to the communications channels;

electrically connecting a plurality of the test points to each other;

driving a current down a selected one of the channels and into one of the ports connected to the selected one of the channels, the one of the ports connected to one of the plurality of the test points;

measuring a voltage drop between the selected one of the channels and another of the channels connected to another of the plurality of the test points;

repeating the driving and the measuring for at least one of a different selected one of the channels or a different another of the channels; and approximating a resistance of the electrical path between at least one of the ports and at least one of the plurality of the test points with the driven currents and the measured voltages.

2. The method of claim 1, wherein the selected one of the channels comprises a driver utilized by the tester to drive test signals through the selected channel to a terminal of the electronic devices to be tested, and the driving a current comprises switching an output of the driver to a current supply.

3. The method of claim 2, wherein the another of the channels comprises a comparator utilized by the tester to compare a voltage level of a signal output by the electronic devices to be tested to a reference signal, and the measuring a voltage drop comprises changing the reference signal until the comparator indicates that the voltage on the another of the channels approximately equals the reference signal.

4. The method of claim 3, wherein the electrically connecting comprises effecting contact between the plurality of the test points and an electrically conductive shorting structure on a reference substrate.

5. The method of claim 1, wherein:

the connecting comprises connecting N ports to N channels, the repeating comprises repeating the driving and the measuring for each unique combination of pairs of the N channels, and the approximating comprises approximating a resistance of each of the electrical paths between the N ports and corresponding ones of the test points.

6. The method of claim 5, wherein the approximating comprises:

for each of the unique pairs of N channels, approximating with the corresponding driven current and measured voltage a combined resistance of the electrical paths between the ports to which the channels of the pair are connected and corresponding test points;

approximating the resistance of each of the electrical paths with the combined resistances of the electrical paths between the N ports and corresponding ones of the ports.

7. The method of claim 1, wherein:
the selected channel is a first of the channels and the another of the channels is a second of the channels;
the repeating comprises:
driving the current down the first of the channels and measuring the voltage drop between the first of the channels and a third of the channels, the third of the channels being the different another of the channels, and
driving the current down the second of the channels and measuring the voltage drop between the second of the channels and the third of the channels.

8. The method of claim 7, wherein the approximating comprises approximating a resistance of electrical paths between each of ones of the ports to which the first, second, and third of the channels are connected and corresponding ones of the test points.

9. The method of claim 1, wherein:
the connecting comprises connecting N ports to N channels, and the selected channel is connected to a first one of the ports, and the other channel is connected to an Nth one of the ports;
the driving further comprising:
connecting the another of the channels to ground, and
placing ones of the channels connected to ports between the first one of the ports and the Nth one of the ports in a tri-state; and
the method further comprising:
determining a voltage at each of the channels in the tri-state; and
approximating resistances between ones of the test points connected to one of the N channels.

10. The method of claim 9, wherein:
the repeating comprises repeating the driving and the measuring for each unique combination of pairs of the N channels, and
the approximating comprises approximating a resistance of each of the electrical paths between the N ports and ones of the test points with the driven currents, the measured voltages, and the approximated resistances between the ones of the test points connected to one of the N channels.

11. A method of determining resistance values of a plurality of resistive interconnections in an interconnect structure, wherein each one of the plurality of resistive interconnections is electrically connected between one of a plurality of ports of the interconnect structure and a corresponding one of a plurality of first test connection points of the interconnect structure, the method comprising:
providing a reference wafer, wherein the reference wafer comprises a plurality of test networks and a plurality of second test connection points arranged to correspond to the plurality of first test connection points, each of the second test connection points connected to a corresponding one of the plurality of test networks;
bringing the interconnect structure into physical contact with the reference wafer so that each one of the plurality of first connection points forms a temporary electrical connection to the corresponding one of the plurality of second connection points and connects each one of the plurality of resistive interconnections to a different one of the plurality of test networks;
sequentially forcing a predefined current into individual ones of the ports;
sequentially measuring a voltage at a common one of the ports corresponding to current flow through each one of the plurality of resistive interconnects to produce a plurality of measured voltages; and
approximating a resistance of each one of the plurality of resistive interconnect paths based on the plurality of measured voltages and the predefined current.

12. The method of claim 11, wherein making electrical connections between the plurality of test networks and a tester comprises:
forming temporary electrical connection between a plurality of third connection points on the interconnect structure and a plurality of fourth connection points on the reference wafer,
wherein each one of the plurality of third connection points is electrically coupled to a corresponding one of the plurality of tester input/output ports through the interconnect structure, and
wherein each of the plurality of fourth connection points is connected a corresponding one of the of the plurality of test networks.

13. The method of claim 11, wherein making electrical connections between the plurality of test networks and a tester comprises coupling the interconnect assembly to a test head of the tester.

14. The method of claim 11, wherein making electrical connections between the plurality of test networks and a tester comprises making a temporary pressure electrical contact between a spring element of ones of the first connection points and a contact pad of ones of the second connection points.

15. The method of claim 11, wherein making electrical connections between the plurality of test networks and a tester comprises making a temporary pressure electrical contact between a spring element of ones of the second connection points and a contact pad of ones of the first connection points.

16. The method of claim 11, wherein coordinating operation of the plurality of tester input/output ports so that the current flows substantially through only one of the plurality of resistive interconnects at a time comprises connecting the corresponding one of the plurality of test networks to a reference potential via the corresponding one of the plurality of tester input/output ports while leaving others of the plurality of test networks floating.

17. The method of claim 16, wherein:
connecting one of the plurality of test networks to a reference potential comprises setting the corresponding one of the plurality of tester input/output ports to a logic level; and
leaving others of the plurality of test networks floating comprises tri-stating others of the plurality of tester input/output ports.

18. The method of claim 11, wherein measuring a voltage comprises:
coupling the common port to a comparator disposed within the tester;
changing a voltage magnitude of a reference signal provided to the comparator until a change of the output of the comparator occurs.

19. The method of claim 11, wherein determining a resistance of each one of the plurality of resistive interconnect comprises determining resistance from the ratio of the measured voltage and the predefined current.

20. The method of claim 11, wherein determining a resistance of each one of the plurality of resistive interconnect paths comprises:
connecting one of the plurality of test networks to a first reference potential using the corresponding one of the plurality of tester input/output ports;

making a first resistance measurement;

connecting the one of the plurality of test networks to a second reference potential using the corresponding one of the plurality of tester input/output ports;

making a second resistance measurement; and determining the resistance of one of the plurality of resistive interconnect paths from the first resistance measurement and the second resistance measurement.

21. The method of claim 11, wherein determining a resistance of each one of the plurality of resistive interconnect paths comprises solving a set of simultaneous equations, wherein unknowns comprise the resistances of the plurality of resistive interconnect paths and knowns comprises the plurality of voltage measurements and the predefined current.

22. The method of claim 11, wherein the unknowns further comprise the resistance of any of: a resistance in series with the common port and a resistance in series with ones of the plurality of tester input/output ports.

23. The method of claim 11, wherein ones of the resistive paths of the interconnect structure comprise a discrete resistor.

24. The method of claim 11, wherein the interconnect structure is a probe card.

25. The method of claim 11, wherein the interconnect structure is a space transformer.

26. The method of claim 11, wherein ones of the plurality of test networks comprise a known resistance.

27. The method of claim 26, wherein the known resistance is a discrete resistor.

* * * * *